(12) United States Patent
Fluhrer

(10) Patent No.: US 8,742,647 B2
(45) Date of Patent: Jun. 3, 2014

(54) CONTROL MECHANISM FOR AN ELECTRICAL APPLIANCE AND EVALUATION METHOD FOR THE CONTROL MECHANISM

(75) Inventor: Henry Fluhrer, Bretten (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 1317 days.

(21) Appl. No.: 12/493,479

(22) Filed: Jun. 29, 2009

(65) Prior Publication Data

US 2010/0007531 A1    Jan. 14, 2010

(30) Foreign Application Priority Data

Jul. 8, 2008  (DE) .......................... 10 2008 033 369

(51) Int. Cl.
*H01L 41/113*    (2006.01)

(52) U.S. Cl.
USPC .......................................... 310/338; 310/369

(58) Field of Classification Search
USPC ................... 310/338, 339, 369, 365, 366
See application file for complete search history.

(56) References Cited

U.S. PATENT DOCUMENTS

| | | | |
|---|---|---|---|
| 5,995,877 A | 11/1999 | Brueggemann et al. | |
| 6,108,211 A | 8/2000 | Diessner | |
| 6,310,428 B1 | 10/2001 | Pulli et al. | |
| 7,136,051 B2 | 11/2006 | Hein et al. | |
| 7,532,202 B2 * | 5/2009 | Roberts | 345/173 |
| 7,554,246 B2 * | 6/2009 | Maruyama et al. | 310/338 |
| 2003/0067449 A1 | 4/2003 | Yoshikawa et al. | |
| 2004/0145577 A1 | 7/2004 | Yajima et al. | |
| 2005/0017602 A1 * | 1/2005 | Arms et al. | 310/339 |
| 2005/0146513 A1 * | 7/2005 | Hill et al. | 345/173 |
| 2006/0262549 A1 | 11/2006 | Schmidt et al. | |
| 2007/0144874 A1 | 6/2007 | Dorwarth et al. | |
| 2008/0246496 A1 | 10/2008 | Hristov et al. | |
| 2009/0128375 A1 | 5/2009 | Heimann et al. | |
| 2010/0109595 A1 * | 5/2010 | Tan et al. | 318/652 |

FOREIGN PATENT DOCUMENTS

| | | |
|---|---|---|
| DE | 198 11 372 A1 | 9/1999 |
| DE | 101 31 243 C1 | 11/2002 |
| DE | 103 59 561 A1 | 8/2005 |
| DE | 10 2004 024 835 B3 | 10/2005 |
| DE | 10 2005 027 192 A1 | 12/2006 |
| EP | 0 512 124 A1 | 11/1992 |
| EP | 1 681 767 A1 | 7/2006 |
| GB | 2 329 020 B | 4/2003 |

OTHER PUBLICATIONS

European Search Report from European Application No. 09163634.0 dated Oct. 14, 2009.
German Search Report from German Application No. 10 2008 033 369.7.

* cited by examiner

*Primary Examiner* — Derek Rosenau
(74) *Attorney, Agent, or Firm* — Alston & Bird LLP

(57) ABSTRACT

A control mechanism for an electrical appliance comprises a deformable or elastic control panel, for example, embodied as a frame of an electric cooking hob. Several piezo sensor elements are arranged under the control panel. The piezo sensor elements are arranged on the rear side of a printed circuit board, the opposite front side of said printed circuit board being arranged or fastened to the underside of the control panel in a planar manner. By determining the difference of the signals of the sensor elements arranged next to each other, it is possible to accomplish an extremely good and safe evaluation of a location where a finger is placed with light pressure on the control panel.

25 Claims, 10 Drawing Sheets

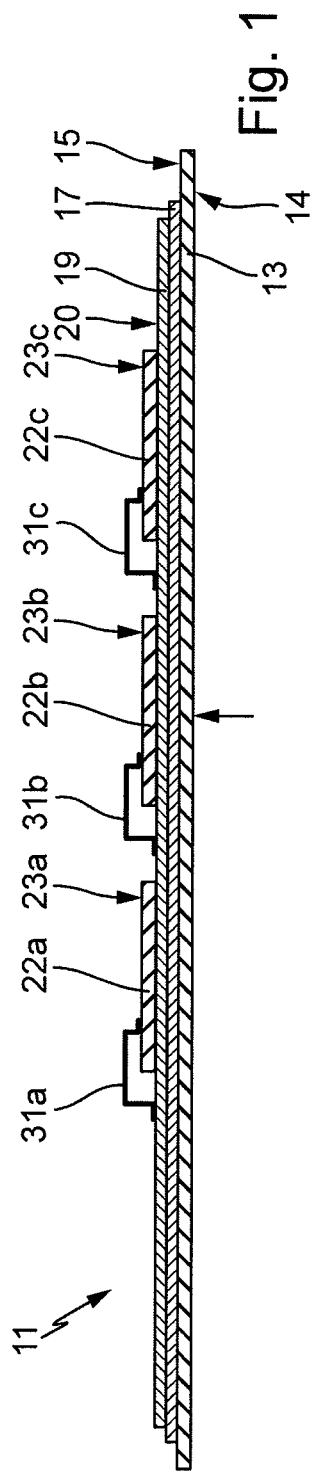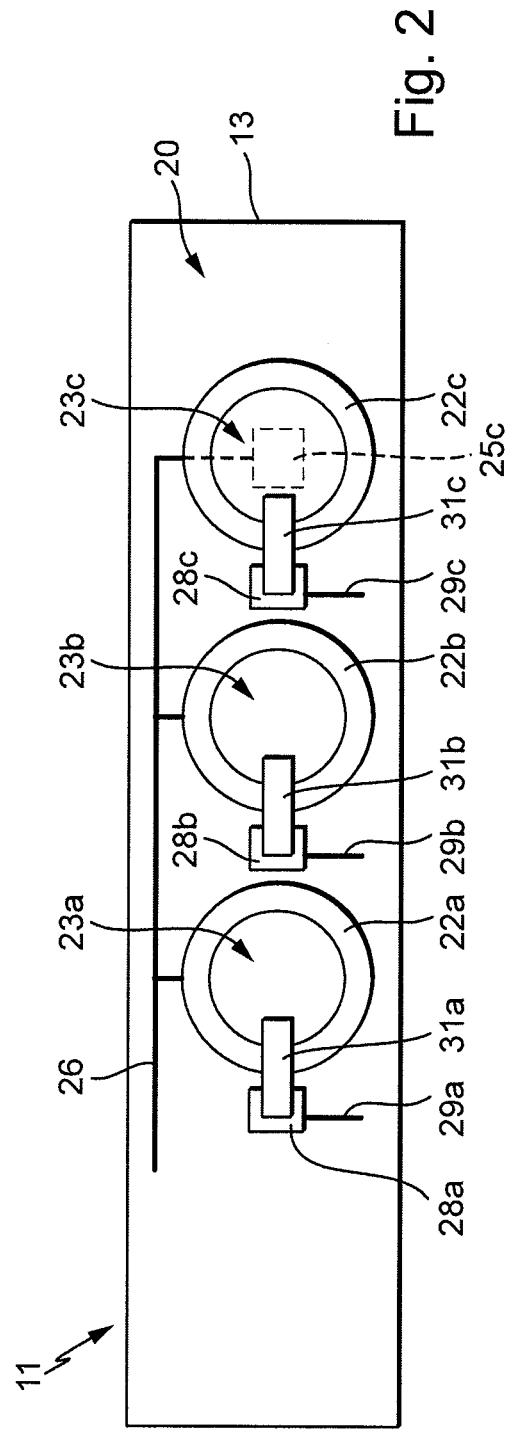

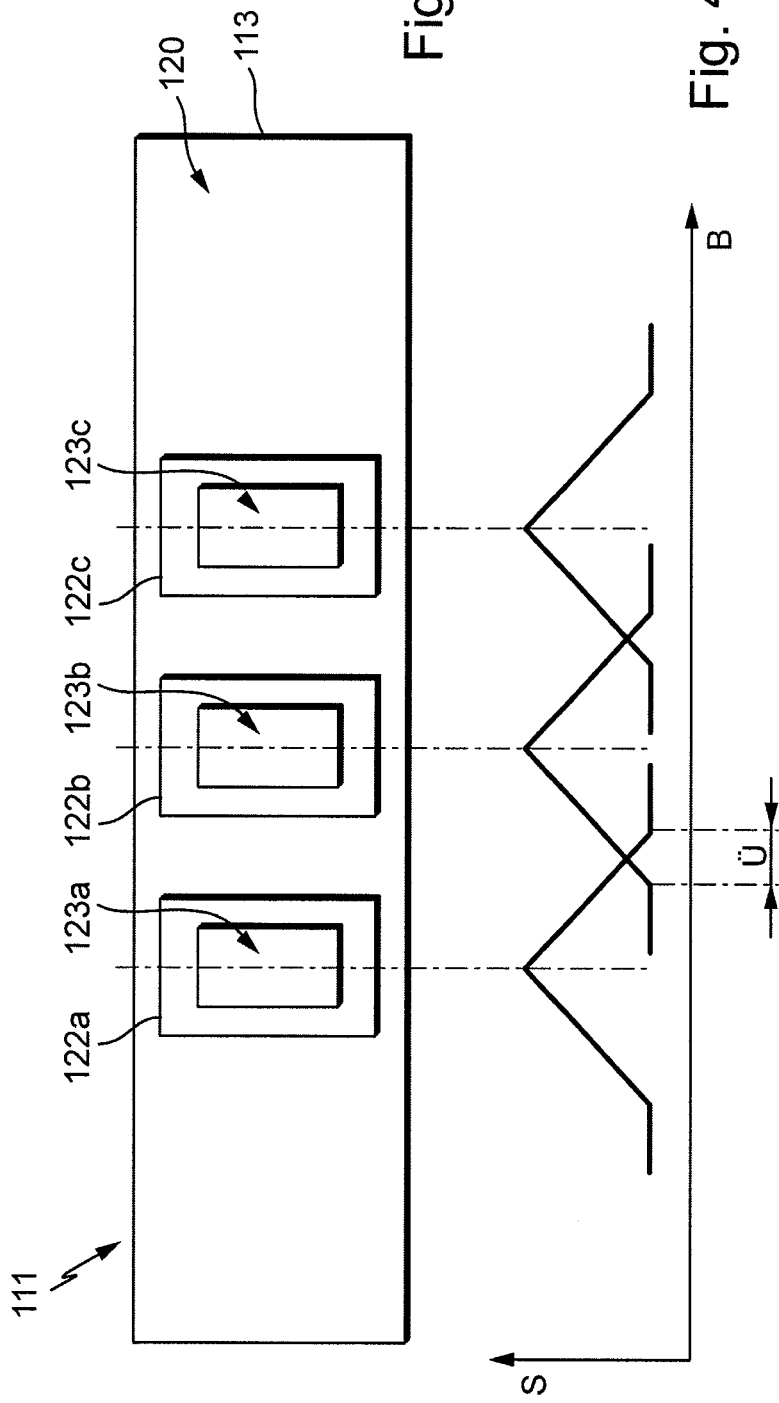

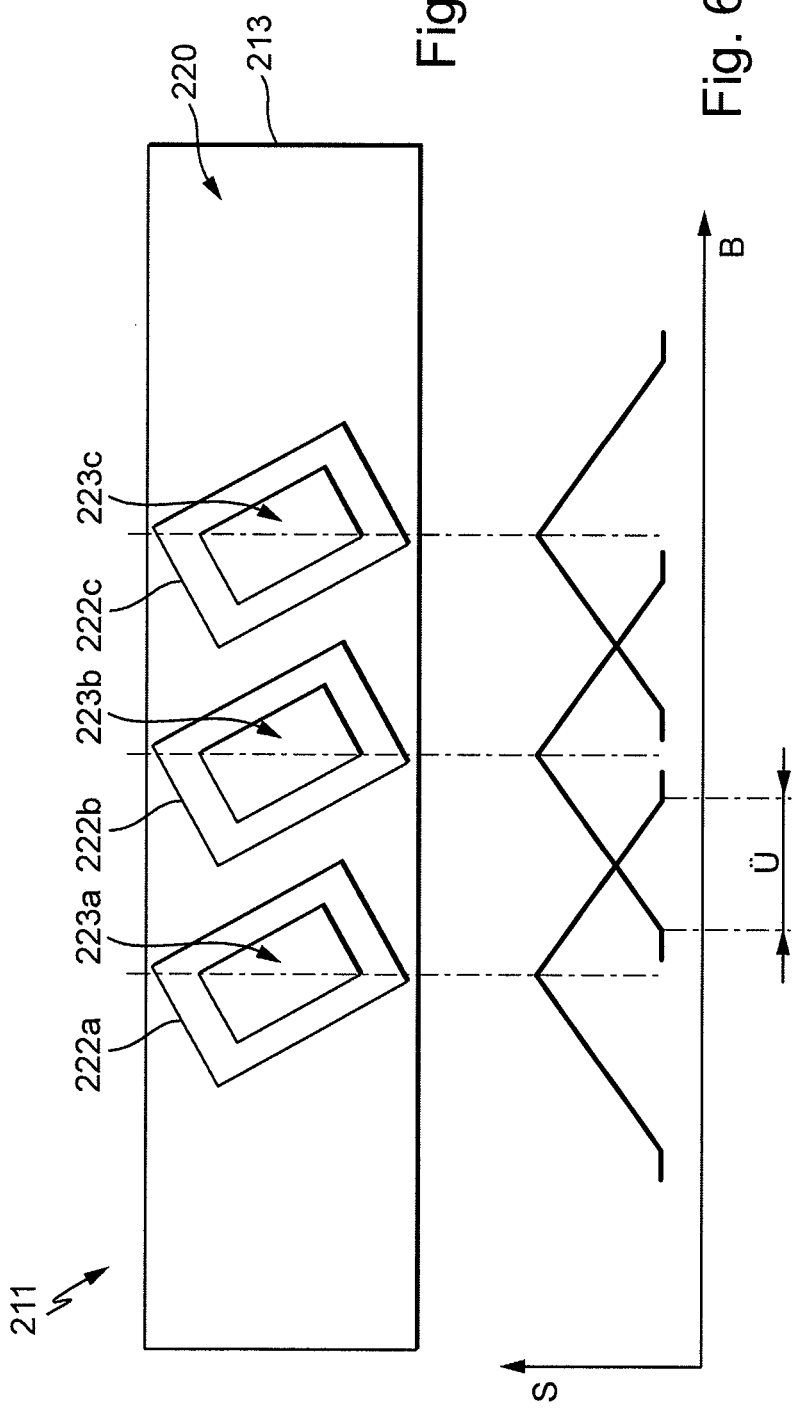

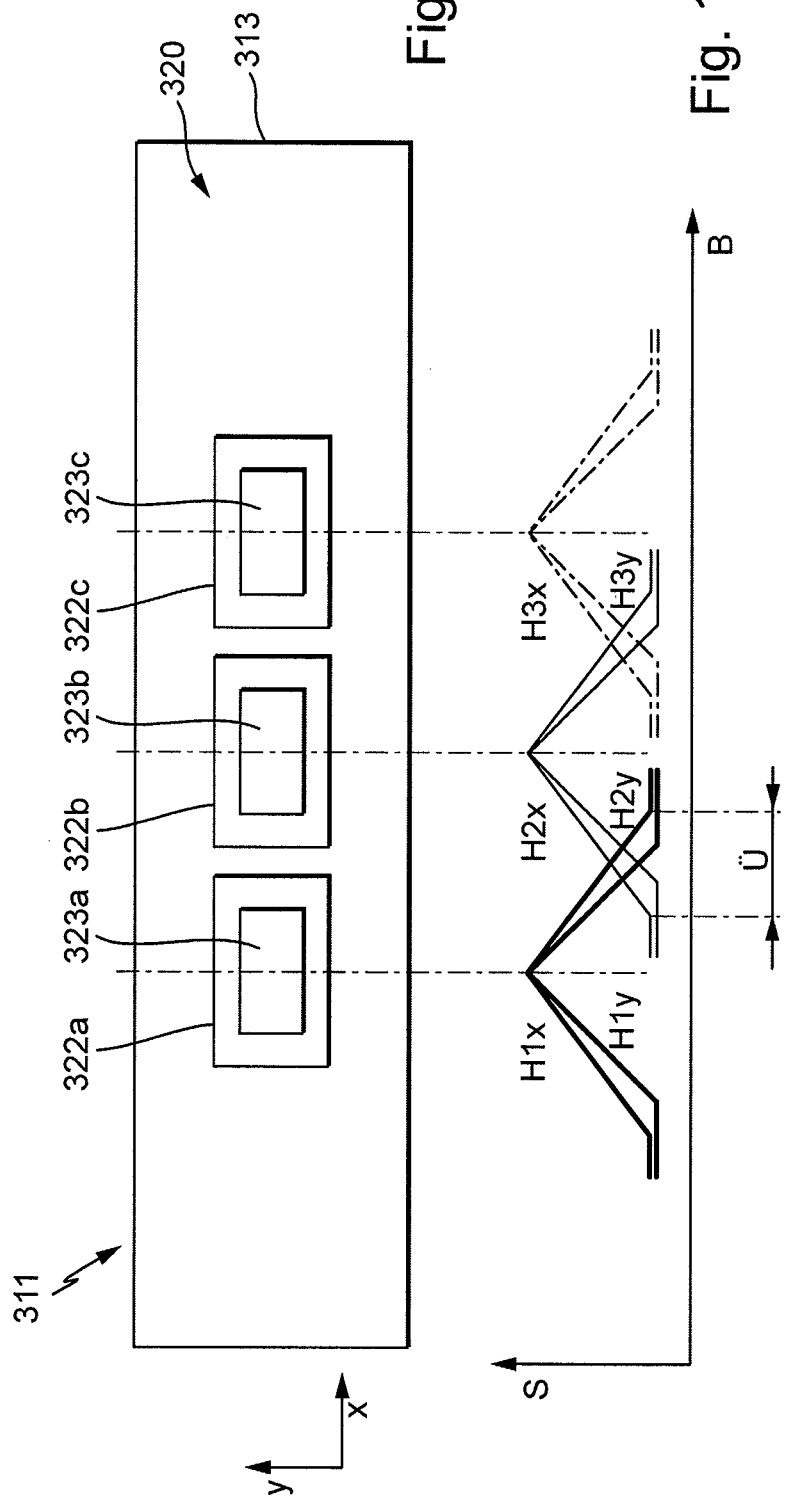

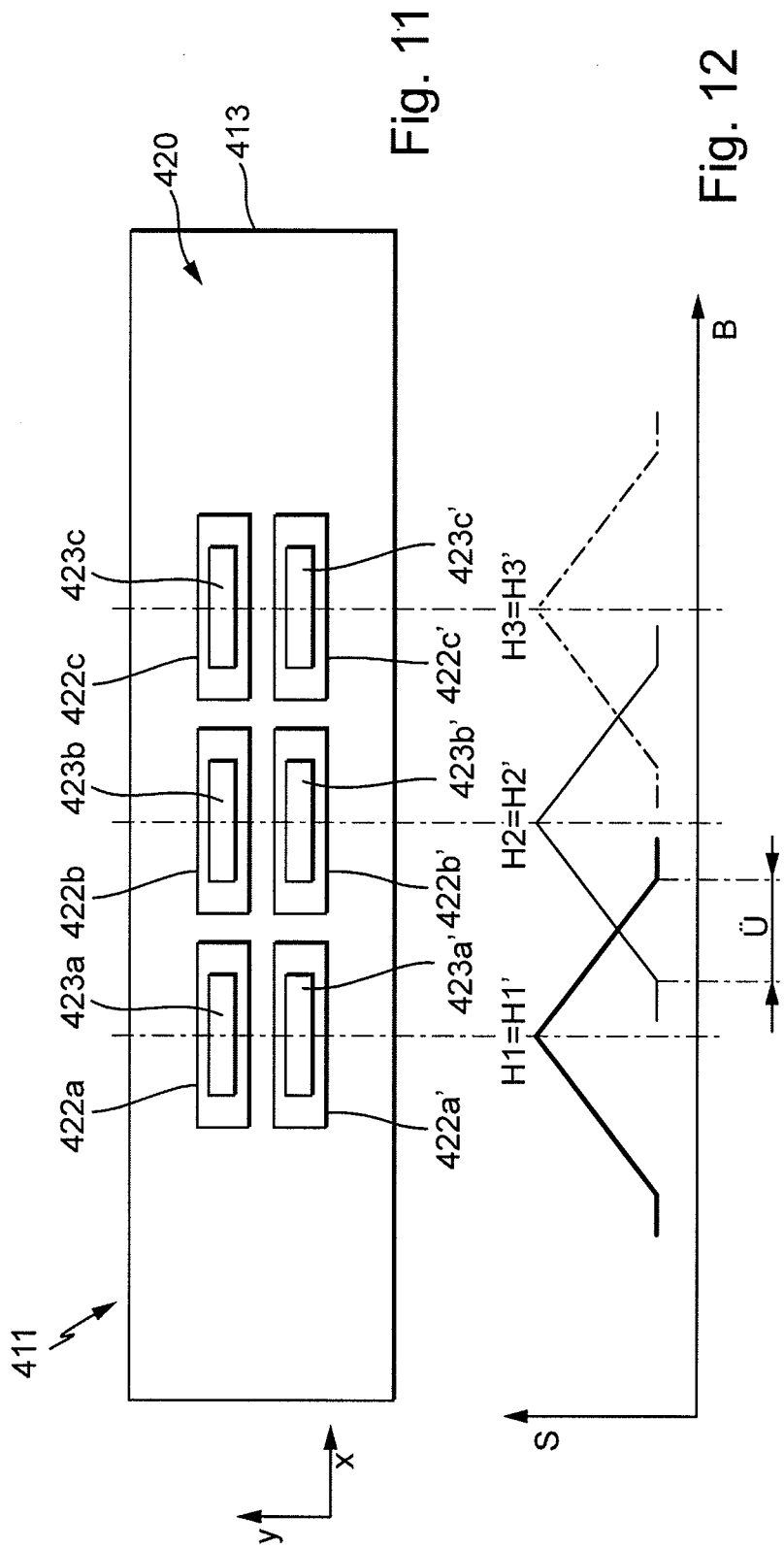

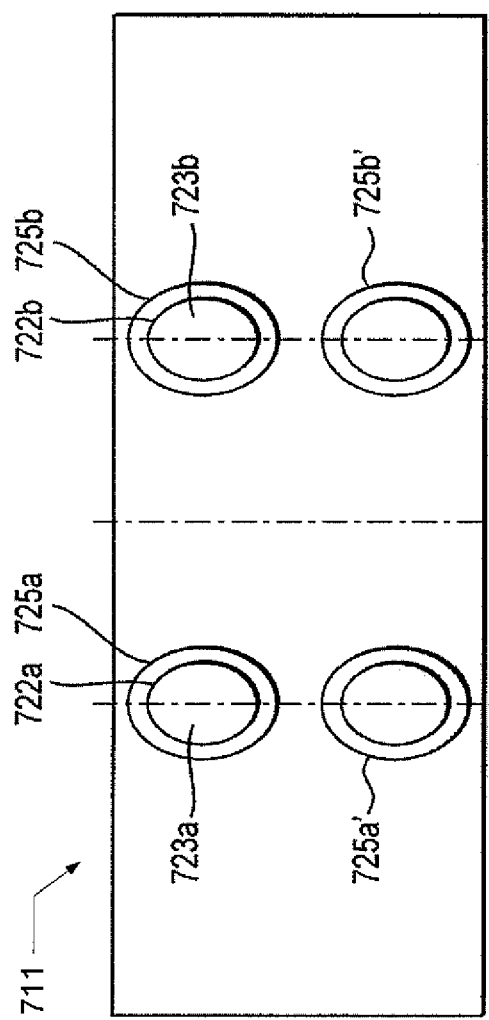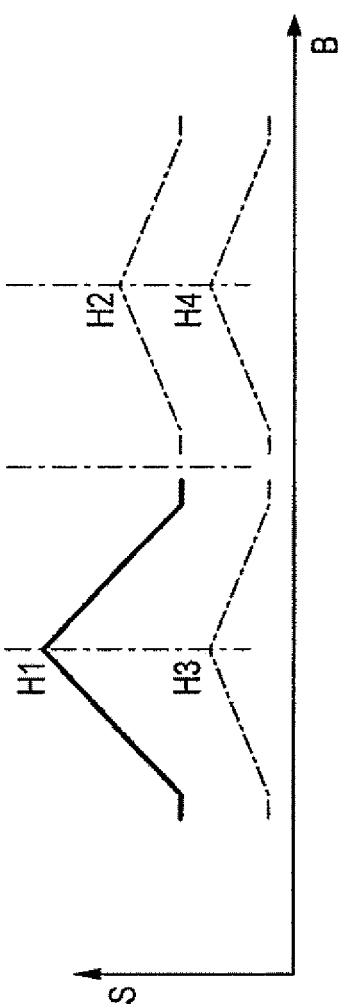
Fig. 15
Fig. 16

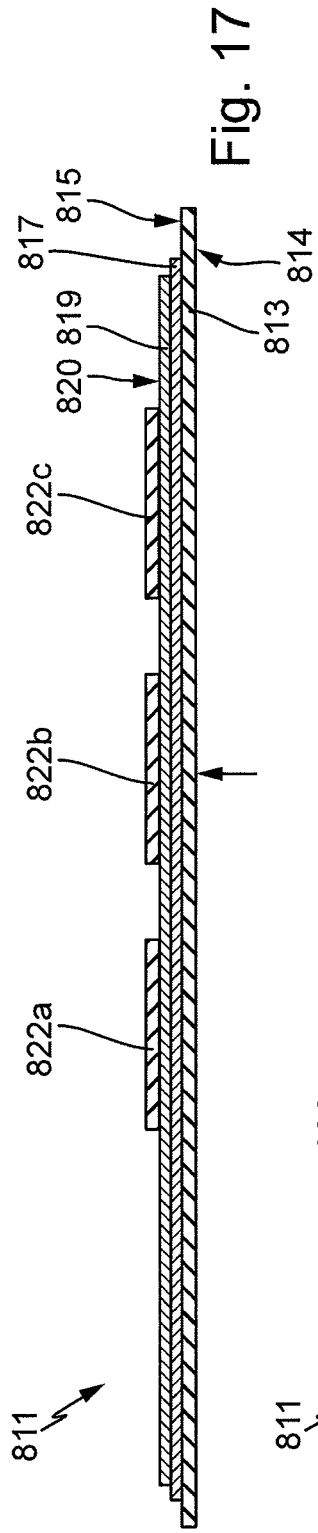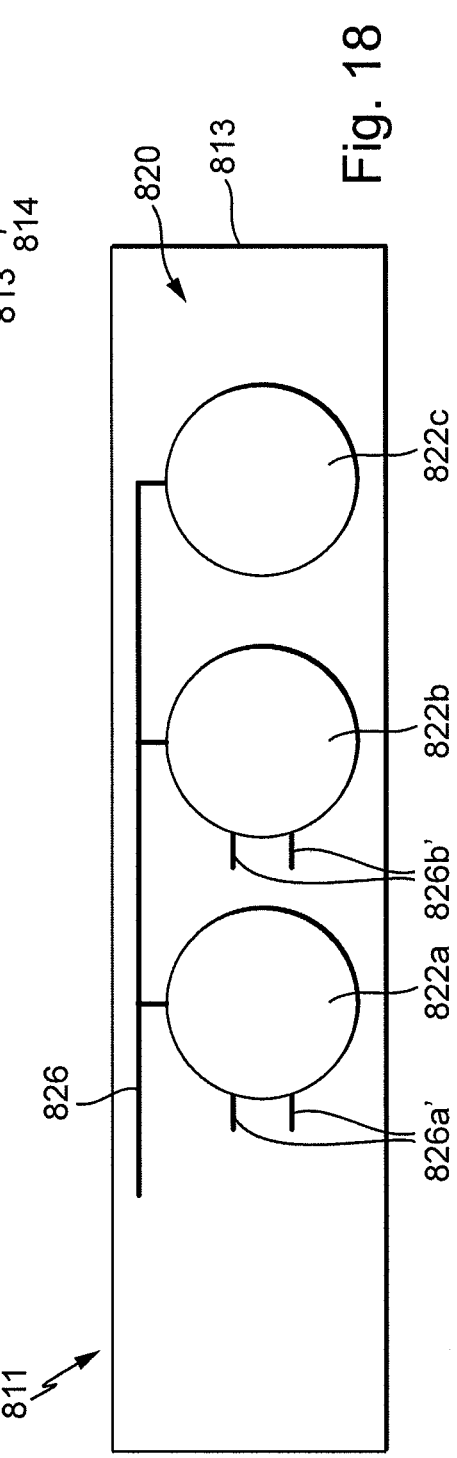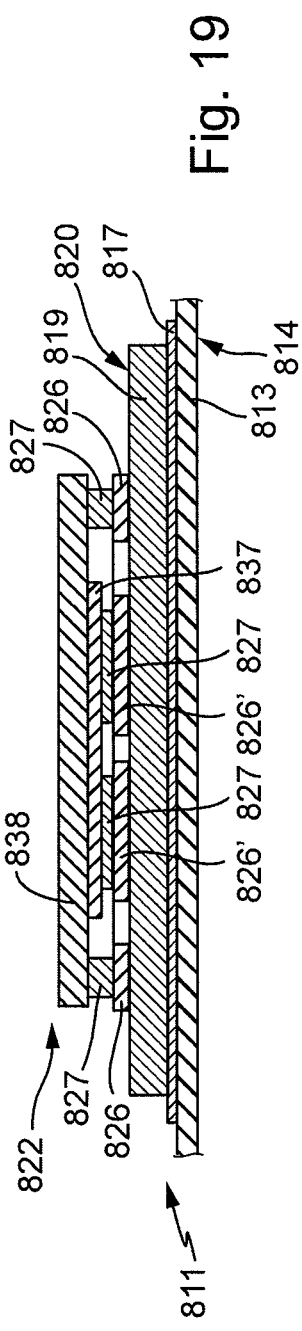

CONTROL MECHANISM FOR AN ELECTRICAL APPLIANCE AND EVALUATION METHOD FOR THE CONTROL MECHANISM

FIELD OF APPLICATION

The invention relates to a control mechanism for an electrical appliance as well as to a procedure for the evaluation of said control mechanism, wherein the control mechanism comprises a control panel that is deformable or elastic, whereby at least one piezo sensor element is arranged under said control panel.

BACKGROUND

From publication DE 198 11 372 A1 it is known to arrange piezo sensor elements as control elements under the stainless steel frame of a cooking hob. These piezo sensor elements can be used to detect a control action by an operator who has placed a finger on the area above the piezo sensor element. The installation of the piezo sensor elements on the underside of the control panel, however, is relatively complex, as is its electric bonding.

Therefore, improved mechanisms and procedures for the piezo sensor elements on the underside of a control panel are required.

SUMMARY

An object of the invention is to provide a control mechanism of the above-described type as well as an evaluation procedure therefore, whereby the disadvantages of prior art can be avoided and, in particular, the arrangement as well as the connection are easily and safely possible, even when a large number of piezo sensor elements is being used.

This object is achieved with a control mechanism displaying the features as well as with an evaluation procedure as claimed herein. Advantageous, as well as preferred, embodiments of the invention are the subject matter of additional claims and will be explained in detail hereinafter. The wording of the claims makes explicit reference to the content of the description.

BRIEF DESCRIPTION OF THE DRAWINGS

Exemplary embodiments of the invention are schematically illustrated in the drawings and will be explained in detail herein after. The drawings show in:

FIG. 1 a lateral sectional view of a first embodiment of an inventive control mechanism comprising piezo sensor elements on a printed circuit board on the rear side of a faceplate;

FIG. 2 a rear view of the control mechanism of FIG. 1, with the depiction of the electrical connection of the piezo sensor elements;

FIG. 3 a simplified illustration of an alternative control mechanism in accordance with FIG. 2;

FIG. 4 a diagram of the signal deviation over the touch path in the control mechanism in accordance with FIG. 3, when the finger is moved from left to right;

FIG. 5 a modification of the control mechanism in accordance with FIG. 3, with sensor elements set at a diagonal with respect to the longitudinal direction;

FIG. 6 the corresponding diagram for the signal deviation over the touch path similar to FIG. 4, with respect to the control mechanism in accordance with FIG. 5;

FIG. 9 another alternative control mechanism similar to FIG. 3;

FIG. 10 the corresponding diagram for the signal deviation over the touch path similar to FIG. 4, with respect to the control mechanism in accordance with FIG. 9;

FIG. 11 another modification of the control mechanism in accordance with FIG. 3, with two rows of elongated sensor elements;

FIG. 12 the corresponding diagram for the signal deviation over the touch path, with respect to the control mechanism in accordance with FIG. 11;

FIG. 15 another modification of the control mechanism in accordance with FIG. 11, with sensor elements in two rows as a type of field;

FIG. 16 the corresponding diagram for the signal deviation over the touch path, with respect to the control mechanism in accordance with FIG. 15; and FIGS. 17-19 another control mechanism comprising piezo sensor elements on a printed circuit board on the rear side of a faceplate, this being a modification of the sensor elements in accordance with FIG. 1.

DETAILED DESCRIPTION OF THE EXEMPLARY EMBODIMENTS

Figure 7:
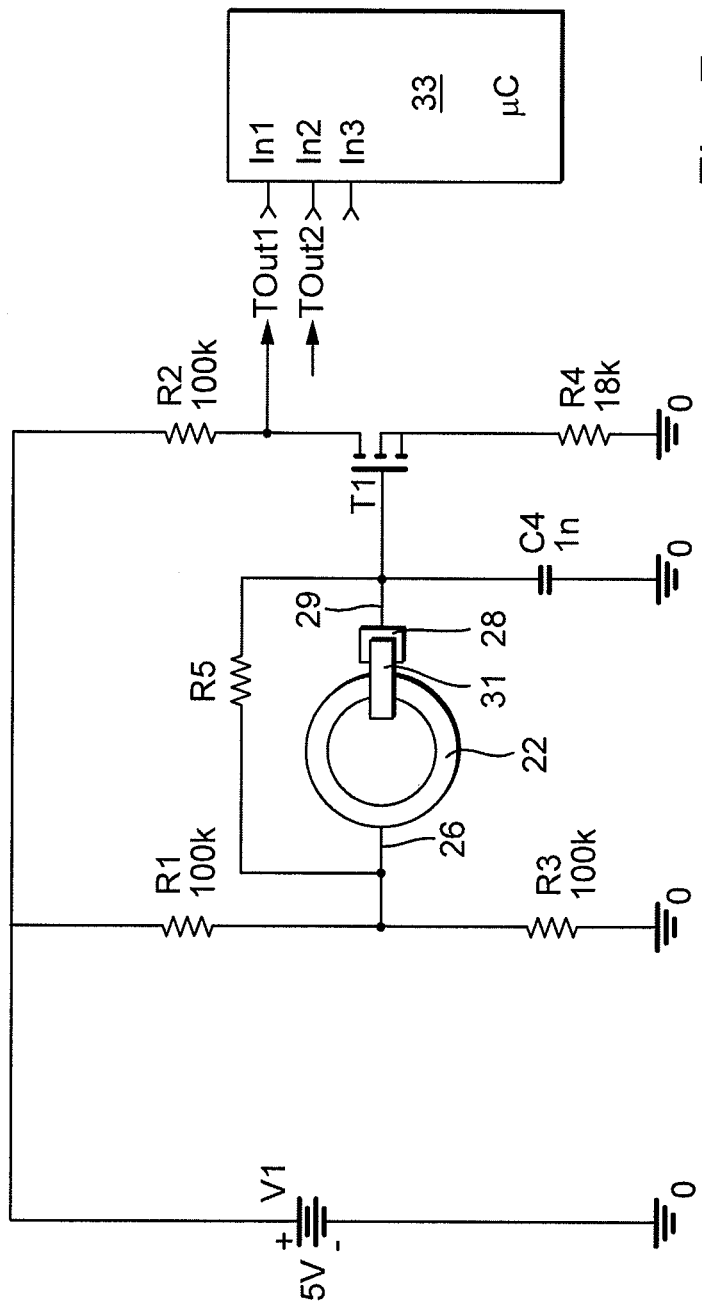
FIG. 7 a wiring diagram for the evaluation of signals of one piezo sensor element.

The invention provides that the at least one piezo sensor element is arranged on, in particular mounted to, the rear side of a printed circuit board. The opposing front side of the printed circuit board is attached or fastened in a planar manner to the underside of the control panel. Consequently, the piezo sensor element is not directly fastened to the underside of the control panel, this being particularly complex with a large number of piezo sensor elements, but is indirectly fastened. In this arrangement, it may be advantageous for the control panel to be part of a frame or of a front faceplate of the electrical appliance or to represent a part thereof. The at least one piezo sensor element may be fastened to the printed circuit board by means of conventional procedures that have been tested in industrial serial production that is known in the assembly of printed circuit boards. Furthermore, the printed circuit board comprising the at least one piezo sensor element may be prefabricated as a modular unit to such an extent that this modular unit need only be connected or fastened to the control panel or to the frame or to the front faceplate of an electrical appliance. This readily permits a precise assembly of the control mechanism with precise functionality, this being important regarding the mechanical assembly in this case.

Advantageously, several piezo sensor elements for several control elements may be provided on the printed circuit board. It is particularly advantageous when each of the control elements of the control mechanism—possibly with the exception of a mechanical on/off switch—are implemented by such piezo sensor elements that are, in particular, of the same type. This simplifies the manufacturing process. In this case, several piezo sensor elements can be arranged in relatively close proximity next to each other and can be controlled with sufficient accuracy. The distance of said piezo sensor elements from each other may even be smaller than the length or width of one such piezo sensor element. Thus, it is also possible to create line-like control elements that are also referred to as "sliders" and that may be implemented with capacitive sensor elements, for example, as disclosed by publications DE 102004024835 B3, DE 102004044355 or DE 102005018292, explicit reference being made to these here.

A piezo sensor element for the control mechanism is advantageously disk-like or is configured as a thin or flat disk. One of the flat sides of the sensor element is then fastened to the printed circuit board, for example, cemented or soldered thereto. In another embodiment of the invention, a piezo sensor element may comprise a piezo ceramic disk. This piezo ceramic disk may be bonded to a metal membrane; in particular, they are cemented to each other. The piezo sensor element has an electrical connection on its upper side, as well as on its underside. Advantageously, this is a planar connection, thus facilitating the connection or the electrical contact on both sides. Such a design of a piezo sensor element is known as a general principle.

Contact pads are provided on the printed circuit board at a point where a piezo sensor element is to be located. These contact pads are, in particular, configured as strip conductors on the printed circuit board or connected therewith, whereby contact output leads may also be configured as strip conductors. For electrical contact, a piezo sensor element is fastened to the contact pad, whereby this may preferably be accomplished with the use of an electrically conductive adhesive, a so-called conducting adhesive or, alternatively, by soldering. Such bonding by adhesion permits reliable fastening and makes it easy to produce an electrical connection.

The piezo sensor element comprises an additional or second electrical contact on the side facing away from the printed circuit board; for example, this may be a contact bracket. Such a contact bracket may extend from an additional electrical connecting field—including the connecting lead—in particular as a strip conductor from the printed circuit board to the exposed side or upper side of the piezo sensor element. Also, a bonding procedure is an option, i.e., the use of a bonding wire as the contact bracket. The contact bracket may also be a standard SMD component, for example a zero-Ohm SMD resistor.

Alternatively, an electrical contact may be accomplished through a printed conductive layer, said layer being printed on the likewise printed insulating layer on the support in this case, this additional electrical connection on the exposed side of the piezo sensor element may be a connection to an analyzer circuit that exists for each individual piezo sensor element. The other connection that occurs with the sensor element directly via a the contact pad of the printed circuit board may then be a joint connection to ground. Of course, it is possible to do this the other way around. The advantage of a joint connection to ground on the exposed side of the piezo sensor element is that, in this instance, a multi-contact bracket may be used. This bracket may be configured in such a manner that it contacts several, in particular all, sensor elements when one or two fastening points are provided on the printed circuit board. An electrical contact of such a contact bracket on the exposed side of the piezo sensor element may be accomplished either by the simple application of pressure and abutment, or by cementing with an electrically conductive adhesive.

An alternative to a contact bracket or a multi-contact bracket that is configured, for example, as a simple metal clip of a wire or of a sheet metal strip may be an electrical contact on the exposed side of the piezo sensor elements via another printed circuit board placed thereon, said circuit board having appropriate contacts. These contacts may either abut directly against the piezo sensor element or they may occur via bridging devices with springs or elastic bodies, potentially also via an aforementioned electrically conductive adhesive.

As an alternative to an upper-side and underside contacting of the sensor element, the two contacts may also be provided from one side in that the piezo sensor element is arranged on the printed circuit board in such a manner that, on the one hand, a connecting surface of the piezo ceramic component of the piezo sensor element faces the printed circuit board and is directly soldered and/or cemented to the printed circuit board. On the other hand, the overlapping residual ring area of a metal membrane that also faces the printed circuit board and is cemented to the piezo ceramic element is also directly soldered or cemented to the printed circuit board, and thus an electrical contact is established. Consequently, an upper-side contact will be redundant. In a particularly advantageous manner, it is then possible to perform the entire assembly and bonding of the piezo sensor element in one soldering or cementing step of operation.

On the side facing away from the piezo sensor element, there may be a division into several electrically conductive surfaces for electrical contact, each of said surfaces being individually connected. This means that a single piezo ceramic component may be functionally divided into several sensors, for example, two, three or four sensors. This multitude of electrically conductive surfaces may advantageously have a shape that deviates from a circular or rectangular form that is divided by straight lines. In so doing, partial surfaces formed in this manner may be intertwined. Consequently, a particularly well-amplified sensitivity can be achieved in differing directions.

In the above-described arrangement of the piezo ceramic component facing the printed circuit board and having several partial electrical surfaces, the connecting surfaces or soldering pads of the printed image of the printed circuit board are ideally configured similar to the partial area structure in such a manner that each partial electrical surface, as well as a residual ring of the metal membrane that overlaps toward the printed circuit board, can be in direct electrical contact with the printed circuit board.

In principal, the piezo sensor elements may be freely placed as control elements on the control mechanism. Advantageously, at least one row of piezo sensor elements is formed, in particular, in order to create an overall elongated line-like control element of the type of the so-called slider. In a simple embodiment, the row of piezo sensor elements may extend in a straight line and, alternatively, may also be curved or arcuate.

In an advantageous development of the invention, several piezo sensor elements, in particular each of them, may be arranged in several continuous and parallel rows. Particularly advantageously, these are two rows, whereby, in particular, the piezo sensor elements are arranged opposite each other in rows.

As has already been mentioned, several piezo sensor elements are advantageously provided on the control mechanism. In an advantageous embodiment of the invention, each of said piezo sensor elements is configured identically. They may have an elongated rectangular shape with one long side and one short side, whereby, in an advantageous embodiment of the invention, their long sides are side by side. In conjunction with an above-described very minimal distance between the piezo sensor elements, this is mainly suitable for making an aforementioned slider. Considering yet another embodiment of the invention, it may be advantageous to arrange the piezo sensor elements with their long sides adjacent to each other and essentially parallel to each other. However, these long sides are rotated at an angle between 15° and 90°, preferably between 45° to 60° and 80°, relative to a line along which the piezo sensor elements are arranged in an approximate manner. When one finger having a specific surface is placed on and moved over this line, it can be achieved, as a result of this, that this finger or its position can be detected by at least one piezo sensor element because said finger is located above said piezo sensor element. As it were, it is not possible for said finger to be lost or not be found or not be detected in the gap created by the distance between two sensor elements. However, it is also possible to optionally arrange the piezo sensor elements in a random and unordered fashion on the printed circuit board.

In the arrangement of the control mechanism on the control panel, the front side of the modular unit consisting of the printed circuit board and the piezo sensor elements may be cemented and fastened by means of a double-sticky adhesive tape to the rear side of the control panel. Such a double-sticky adhesive tape may be a film-type tape and should have a minimal thickness, advantageously approximately 0.2 mm or 0.1 mm, or even less. The thickness of the adhesive tape may compensate for tolerances. If such a double-sticky adhesive tape is applied to the control mechanism in the factory, this permits a preliminary assembly in view of the fastening or cementing operation. Alternatively, bonding may occur by the application of adhesive using an adhesive film applied over an area. Generally, bonding offers the advantage that a rigid coupling of the printed circuit board to the control panel is ensured, said bonding being sensitive to pressure applied to a key.

By arranging the piezo sensor elements on the printed circuit board and by arranging this printed circuit panel on the rear side of the control panel it is possible, by using an—albeit minimal—bending deflection of the control panel by placing a finger or the like thereon and by transmitting this elastic deflection to the piezo sensor element, to dispense with a counter surface for the sensor elements, as is otherwise necessary for such a control mechanism. Indeed, prior art as embodied by publication DE 198 11 372 A1 still requires additional counter surfaces that mean additional time and cost for assembly and components. Thus, the side of the sensor element facing away from the control panel may be essentially—preferably fully—exposed. As a result of this, the design of the control mechanism as well as any mounting to the control panel are simplified.

Another embodiment of the invention may provide that the control panel comprise cutouts behind which illuminated displays may be arranged. Such illuminated displays may be implemented with the use of LEDs and require cutouts in particular in cases in which the control panel consists of metal or another opaque material. Such illuminated displays in the form of LEDs or of seven-segment displays, for example, may likewise be arranged on the printed circuit board that also holds the piezo sensor elements. The invention is particularly well-suited for control panels of metal, in particular of stainless steel or aluminum. They may have a thickness of a millimeter or less or be even greater in certain situations. In the region of the piezo sensor elements, the material thickness advantageously remains the same without thickness reduction, so that the manufacture of such a control panel out of a single metal component is simplified. Due to the setup of the control mechanism in accordance with the invention, it is possible—even considering relatively thick and thus relatively stiff control panels—to generally detect the placement of a finger without the application of too much force, for example, 1 N or even significantly below that, by means of one piezo sensor element, or to also specifically distinguish the point of placement with several, closely adjacent piezo sensor elements. Greater key pressures, for example, clearly greater than 10 N, may also be accepted, for example, if keypads are to be vandalism-resistant.

In another embodiment of the invention, the control mechanism advantageously comprises a signal analyzer that may at the same time be disposed to activate the sensor elements. This signal analyzer may comprise an impedance conversion of the signal generated by a piezo sensor element or may convert the impedance of a signal tapped from said element. Preferably, such an impedance conversion comprises a transistor circuit and is connected to a microcontroller that is also part of the signal analysis, or is possibly even the control. In the development of the invention, the signal analyzer may comprise differentiating means to form a signal difference between two adjacent piezo sensor elements. To do so, each of the differentiating means is connected to the sensor elements, whereby an output of such a differentiating means is sent to further processing or evaluation. Advantageously, the control mechanism may comprise at least three piezo sensor elements and may provide that two directly adjacent piezo sensor elements, respectively, be connected to one differentiating means. Consequently, the first and the second sensor elements may be connected to a first differentiating means, the second and third sensor element may be connected to a second differentiating means, etc. The output of adjacent differentiating means is then fed to a signal analyzer in order to determine at which sensor element or at which point the greatest signal change has occurred. Advantageously, the provided differentiating means may be operational amplifiers that may comprise a downstream signal amplification for reliable detection. In an alternative embodiment of the invention, the differentiating means may not comprise discrete components such as operational amplifiers but may comprise a microcontroller that may also be used for signal evaluation. The result of an impedance conversion may be output directly to an A/D converter input of a microcontroller if no separate operational amplifier is provided.

These and other features are obvious from the claims as well as from the description and the drawings and the individual features can be implemented by themselves or in the form of sub-combinations in an embodiment of the invention and may be implemented in other fields and represent advantageous as well as independently protectable embodiments, for which protection is claimed here. The division of the application into individual sections, as well as the sub-headings, do not restrict the general validity of the statements made thereunder.

FIG. 1 shows a control mechanism 11 in accordance with the invention, whereby said control mechanism can be used, for example, in an aforementioned electrical appliance or be a component of said electrical appliance. The control mechanism 11 comprises a faceplate 13, for example, configured as a large-surface faceplate of an electrical appliance. The faceplate may consist of plastic or of sheet metal, for example, stainless steel. The faceplate has a front side 14 to which force is applied as indicated by an arrow. This force may be generated by an operator who places a finger on the front side 14 or who applies pressure thereto.

The functional features of the control mechanism 11, as it were, are provided on a rear side 15 of the faceplate. For this, a printed circuit board 19 being the carrier of the piezo sensor elements 22 is mounted to the faceplate 13 by means of an adhesive strip 17 that may be double-sticky or may also be substituted for an adhesive layer. The piezo sensor elements 22a through c are affixed to the rear side 20 of the printed circuit board 19. In principal, said piezo sensor elements could also be directly applied in the form of thick-layer components to the printed circuit board 19 by means of a coating process such as, for example, a screen printing process or the like. Advantageously, however, said piezo sensor elements are produced, for example as described above, as separate components of a piezo ceramic disk and a metal membrane, and are subsequently fastened to the printed circuit board 19. The obvious fastening method is bonding, in particular with the use of an electrically conductive adhesive.

On the one hand, an electric contact on a piezo sensor element 22 occurs on said element's upper side 23a, 23b, and 23c, as will be explained in detail hereinafter. On the other hand, an electric contact occurs on the underside via a contact pad 25c indicated in dashed lines in the plan view of FIG. 2, said contact pad adjoining a ground contact strip conductor 26 on the printed circuit board 19. The contact pads 25c and the ground contact strip conductor 26 are applied in the form of conventional copper strips to the printed circuit board 19 and connect the ground connections of all the piezo sensor elements 22 with each other. Then the piezo sensor element 22 is fastened, advantageously cemented, to this contact pad 25c that may also have a different size configuration.

To the left, next to the piezo sensor elements 22a, 22b and 22c, contact pads 28a, 28b and 28c are provided, each having one connecting strip conductor 29a through c. These contact pads 28a, 28b and 28c including the connecting strip conductors 29, are also applied—like the above-described contact pads 25c, including the strip conductor 26—to the printed circuit board 19, preferably in the form of copper strips. The electrical contact of a contact pads 28a, 28b and 28c on the upper side 23a, 23b, and 23c of the piezo sensor element 22 occurs via contact brackets 31a, 32b and 31c. These are bent in a U-shaped manner as is obvious from FIG. 1 and consist of thin elastic copper sheet material. One end is fastened, for example, permanently soldered to a contact pad 28. The other end abuts against the upper side 23a, 23b and 23c due to being biased. Here, too, a permanent connection is possible, for example by soldering or by cementing. Each individual piezo sensor element 22a, 22b and 22c may be actuated or analyzed individually via the connecting strip conductors 29a through c. The assembly of the piezo sensor elements 22 (e.g., piezo sensor element 22 of FIG. 7), as well as of the contact brackets 31 (e.g., contact bracket 31 of FIG. 7) may be automatic, thus offering the possibility of a high-speed and precise manufacture in large quantities.

FIG. 3 shows a plan view of another control mechanism 111 that also comprises three piezo sensor elements 122a, 122b and 122c. To avoid confusion, their electrical connections are not illustrated, however, they may be configured like those of the control mechanism 11 in accordance with FIGS. 1 and 2. Furthermore, representing a modification of the other control mechanism, this case provides for a rectangular shape of the piezo sensor elements 122a, 122b and 122c occurring on upper sides 123a, 123b, and 123c. In this case, in particular, the control mechanism 111 is to detect not only the punctiform triggering of a control function due to the application of a force by placing a finger on the front side of the faceplate 113 in the center above a piezo sensor element; rather, it is also supposed to be possible to draw an applied and pressed-down finger over the region of the piezo sensor elements 122a, 122b and 122c affixed to the rear side 120. Such a control mechanism is also referred to as a slider and, considering the principle, is basically known from publications DE 102004024835 B3, DE 102004044355 or DE 102005018298. This linear or dragging motion may be linked to various control functions, this, however, plays no part in the present patent application. Rather, the issue in the present patent is application is the constructive assembly of such a control mechanism, as well as—in particular, in conjunction with several sensor elements that are arranged side by side—the implementation or, first and foremost, also the evaluation of such a slider function.

It is obvious that the application of a force to the front side of the faceplate 113 in accordance with FIG. 1 also effects a bending deflection of the faceplate, even though such a deflection may be extremely minimal, for example, in the pm range. This bending deflection of the faceplate also effects a bending deflection of the printed circuit board and thus also of the piezo sensor elements, which can be easily evaluated. However, when this happens, in particular when relatively stiff materials are used for the faceplate, it cannot be fully avoided that such bending occurs not only over a single piezo sensor element that is to be actuated, as it were, but also over adjacent sensor elements, and, consequently, a signal deviation is also created here, even though this signal deviation is much smaller. Signals may overlap, as it were, in particular when the piezo sensor elements 122a, 122b and 122c are relatively close side by side for such a slider function as in FIG. 3. This is obvious from the diagram in FIG. 4, where the signal deviation S is plotted as a function of the point on the touch path B. It can be seen that the signal deviation S is greatest on a chain-line center axis of each piezo sensor element 122a, 122b and 122c. With increasing distance, the signal deviation S decreases to the left or to the right relative thereto. The linear course that is shown here represents a simplification and need not necessarily be linear in practical applications, however, it approximately represents the situations.

Also, it can be seen that when a finger is drawn along, the touch path B is traveled, as it were. There are several areas in which the signal deviation S between the piezo sensor elements 122a, 122b and 122c displays approximately the same value on both sides, i.e., at a point of intersection of both triangular curves. In this region, there is a so-called overlap area U, in which a Signal S is relatively small at each of the two sensor elements. By comparing them with each other, the exact point of touch or the touch path B can be detected also in this case. This will be explained in greater detail hereinafter.

FIG. 5 shows a modification of FIG. 3, said modification comprising a control mechanism 211 including the printed circuit board 213. Piezo sensor elements 222a, 222b and 222c that are similarly constructed in principle and have upper sides 223a, 223b and 223c are tilted by approximately 30° relative to the longitudinal axis, along which the sensor elements are located, i.e., in FIG. 3 as well as in FIG. 5. Inasmuch as the bending deflection of the faceplate is not strictly punctiform when pressure is applied with the finger but extends over a specific range and inasmuch as this range when moving along the longitudinal direction of the arrangement of the piezo sensor element 222a, 222b and 222c, affixed to rear side 220, also extends somewhat in a direction perpendicular to this direction of movement, there is a stronger overlap of the sensor elements or the signal deviations S tapped from them. This is obvious from the diagram of FIG. 6, where the overlap U is significantly greater than in FIG. 4. Thus, this represents the aforementioned advantage of the oblique position of elongated or elongated rectangular sensor elements. That is to say, the position of one finger with pressure between the sensor elements can be better detected because a greater signal deviation S exists in the intermediate space between the sensor element, i.e., in the region of the overlap O.

FIG. 7 is a circuit diagram that shows how an impedance conversion may be configured in an inventive procedure for the evaluation of signals of a piezo sensor element 22. It can be seen how the ground contact strip conductor 26 is passed over a resistor R3 to ground, while a direct voltage V1 is applied thereto via the resistor R1. Ground contacts 26 and connections 29 are connected via the resistor R5. Furthermore, this connection goes to the base of a transistor T1, and is also connected to ground via the capacitor C1. The supply voltage V1 is applied to the transistor T1 via the resistor R2; at the same time, it is connected to ground via a resistor R4. A signal output Tout, goes from the circuit to an input In, of a control 33 that is implemented in a microcontroller. Furthermore, the signal outputs of the other piezo sensor elements 22 go to the control 33 exactly as shown by the signal output Tout2. The function of this impedance conversion is easy to understand.

Inasmuch as the signal yield is based on the piezo effect of the piezo sensor elements 22, it is true, relatively high signal voltages but very low signal currents are fed back. Therefore, the above-described impedance conversion is of advantage in an electronic evaluation. To do so, the transistor circuit in accordance with FIG. 7 was developed, which circuit can be implemented in a relatively cost-effective manner. The signal outputs Tout can then be directly connected to the A/D converter input of the microcontroller 33.

Figure 8:
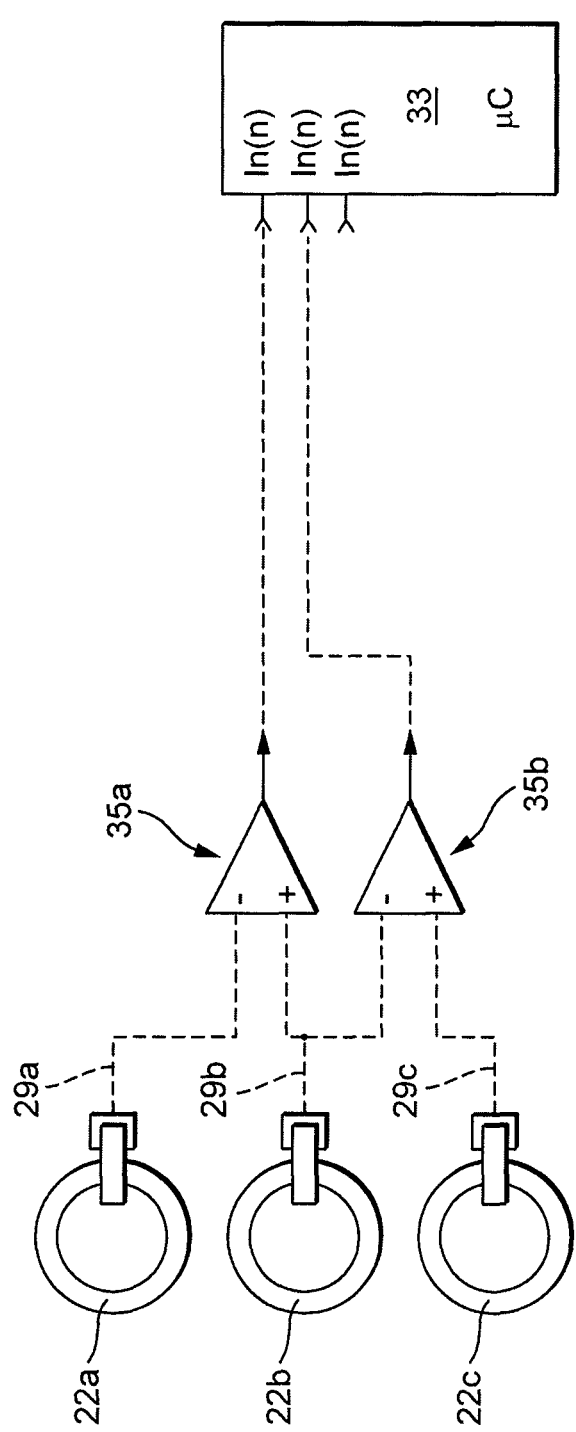
FIG. 8 another wiring diagram for the evaluation of signals of several piezo sensor elements with the use of the inventive difference analysis procedure.

FIG. 8 shows how, independently of any signal processing, an inventive difference-measuring procedure can be used on a single piezo sensor element 22 for the evaluation of signals. In particular, it is possible—with punctiform actuation as well as with an aforementioned slider actuation—to improve the evaluation.

To accomplish this, a first piezo sensor element 22a is connected to the minus input of an operational amplifier 35a via a connection 29a. The connection 29b of a second piezo sensor element 22b is connected to the plus input of the same operational amplifier 35a as well as to the minus input of a second operational amplifier 35b. The connection 29c of a third piezo sensor element 22c is connected to the plus input of the operational amplifier 35b. This can be continued as desired for any additional piezo sensor elements.

The output signal with the difference of the signals of the second piezo sensor element 22b and the first piezo sensor element 22a represents the output of the operational amplifier 35a. In the operational amplifier 35b, this is the difference between the signals of the third piezo sensor element 22c and the second piezo sensor element 22b. These signal differences go to a signal input In(n) of the control 33 for evaluation to determine at which point or on which sensor element 22 the actuation has occurred.

An essential feature for perfect and interference-independent operation of the control mechanism is an intelligent signal processing. Interferences may be EMC interferences such as burst loads, for example. Inasmuch as the control mechanism described herein is based on piezo technology, this relates, as it were, to an acoustic unit that is also exposed to acoustic interferences. These interferences are manifold and may be impact sound applications due to motor humming, knocking on the faceplate, airborne noise, etc.

In order to find a possibility of compensating for interference parameters or interference, a theoretical examination of the time response of interference application or interference parameter input on the individual sensor elements may be provided. If it is assumed that the velocity of sound in a body, i.e., for example, a control panel of metal, is greater than the speed of operation, i.e., the placement of a finger, by a multiple, it may be assumed that the amplitude change due to interference feedback occurs nearly cophasally in each piezo sensor element, i.e., the signal change in all sensor elements takes place in the same direction, as it were.

Considering this situation, a procedure for eliminating interferences may be applied in that the described signal difference between two adjacent sensor elements is taken. For the same signal change due to interference, the signal sum then is equal to zero. However, if the sensor element is actuated as instructed, said element experiences a different signal deviation than the neighboring sensor elements, and the signal difference becomes unambiguously positive or negative, depending on whether the sensor element is pushed or released.

In order to increase the compensation of the interferences this difference may also be taken, as desired, between several neighboring sensor elements. In so doing, it is imperative that—upon the determination of the difference—the pushed sensor element must always form a maximum compared to all other sensor elements; see FIG. 8.

In a test design, the effect of this type of compensation was proven via a determination of signal differences by means of an operational amplifier circuit with downstream signal amplification. A very good distance between the useful signal and the interference signal, i.e., the signal-to-noise ratio, could be achieved. As a result of this, it was possible, on the one hand, to design the control mechanism so as to be highly pressure-sensitive and, on the other hand, it was found that the influence by pressure on the neighboring sensor elements could almost be eliminated due to the total bending deflection of the faceplate.

In later applications, the interference value compensation by difference determination can be reasonably performed in a cost-effective manner in the microcontroller. Then, only an impedance conversion for each sensor element in accordance with FIG. 7 is required as the electronic circuit connection, said impedance conversion already including a signal amplification.

In the exemplary embodiment in accordance with FIG. 9, a control mechanism 311 comprising a faceplate 313 is shown, said mechanism being basically the same as that of FIG. 3. However, in this case, the piezo sensor elements 322a, 322b and 322c, affixed to rear side 320,—viewed in longitudinal direction—are not aligned transversely with respect to the direction of extension in accordance with the touch path B but in longitudinal direction of said touch path. Thus, said piezo sensor elements are rotated by 90° relative to FIG. 3 and are at a smaller distance from each other. In the corresponding diagram of the signal deviation S over the touch path B in accordance with FIG. 10, the signal deviation S is shown for the Y-direction and for the X-direction, respectively. Due to the longitudinal extension along the line of arrangement of the piezo sensor elements 322a, 322b and 322c having upper sides 323a, 323b and 323c, the curves of the signal deviations S are wider or more expanded, as is shown by those depicted at the top. Using this arrangement, it can be achieved that a key touch outside the key area of the piezo sensor elements 322a, 322b and 322c in this Y-direction, which is transverse to the touch path B, becomes less sensitive. As a result of this, a type of directed sensitivity along or in the direction of the touch path B is possible.

In yet another control mechanism 411 comprising a faceplate 413 in accordance with FIG. 11, two parallel rows of piezo sensor elements are provided, each of these rows corresponding to the arrangement of FIG. 9 and only being configured in a slightly narrower manner. The piezo sensor elements 422a, 422b and 422c having upper sides 423a, 423b and 423c extend in the upper row. The piezo sensor elements

422a', 422b' and 422c' having upper sides 423a', 423b' and 423c' extend in the lower parallel row at a smaller distance. As a result of this arrangement, a sensitivity is achieved in X-direction that is again amplified compared to that of FIG. 9, i.e., in the direction of the touch path B. The shown signal overlap U also is somewhat large. The directed sensitivity that is again amplified has the effect that a key touch in the center of the key can be excellently localized and detected when the signal deviation S of the upper and lower piezo sensor elements is the same or nearly the same. However, as soon as the signal deviations are clearly different from each other, the signal or the key touch is discarded. Then, a point of the touch path B has tendentially deviated too far from the line of the touch path B in Y-direction and then no longer corresponds to a touch or actuation as instructed.

Instead of the two separate piezo sensor elements that are arranged above each other, it is possible to use a single piezo component and two separate upper sides or to install these generally established electrodes as a signal tap. Then, strictly from the viewpoint of function, this corresponds to two piezo sensor elements; only the mechanical or setup effort has been slightly reduced.

Figure 13:
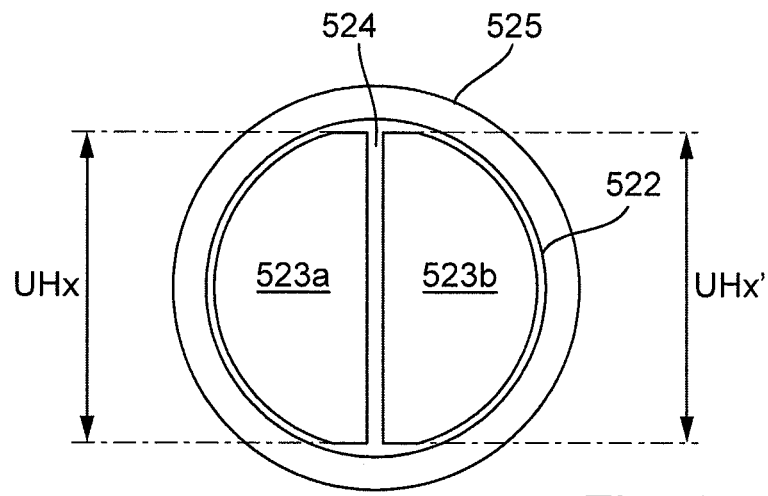
FIG. 13 an enlarged illustration of the sensor element that has been divided into two parts.

The illustration in accordance with FIG. 13 shows an example of such a piezo sensor element 522 that has been divided into two parts, as it were. The disk-shaped piezo sensor element 522 having the slightly smaller diameter is positioned on a contact pad 525. Said sensor element has upper sides 523a and 523b that have been divided into two parts, or said sensor has corresponding electrically conductive coatings or electrodes that are contacted by a contact bracket (that is not illustrated here) in accordance with FIGS. 1 and 2. As a result of this, one piezo sensor element is made into an element that has been divided in two parts with the effort and possibilities of a dual signal evaluation, however, with the assembly effort of only one single sensor element or piezo ceramic substrate. A dividing line 524 between the upper sides 523a and 523b or between these generally covering electrodes would then, in an arrangement in accordance with FIG. 11, be aligned with the direction of the touch path B, i.e., in X-direction. The main advantage of this embodiment is that a highly accurate difference measurement is possible because the sensors are paired on the same piezo ceramic substrate, as it were. Voltage tolerances that might occur due to a different disk thickness, polarization, adhesion, ambient temperature or the like are thus compensated for. Considering the same bending deflection in case of actuation along the dividing line 524, the same voltage $UH_x$ and $UH_x'$ occurs on the two upper sides 523a and 523b. This bending deflection is then the same when a key touch occurs exactly in the middle between two upper sides 523a and 523b, i.e., above the dividing line 524. This is best for a line-accurate position detection of the key touch in one direction, namely in the direction of the dividing line 524.

It is easily conceivable that, instead of dividing the upper side of the piezo sensor element into two parts, an even finer division may be performed. This, for example, may be a tetrant or quadrant division, i.e., three or four equally large segments of a circle.

Figure 14:
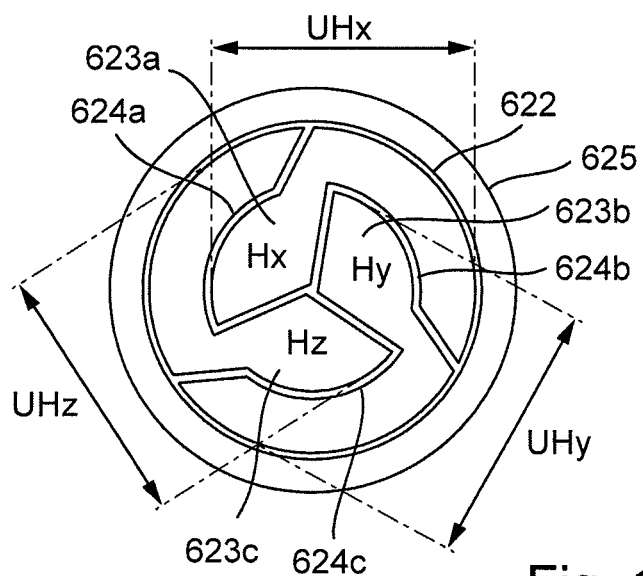
FIG. 14 another modification of an embodiment of a sensor element displaying a specific division of the sensor area.

An optimized version, as it were, of such a piezo sensor element that has been divided into three parts is shown in FIG. 14. Again, a disk-shaped piezo sensor element 622 is arranged on a metal contact pad 625. This sensor element has three upper-side regions 623a, 623b and 623c, each having identical configuration and being separated from each other by dividing lines 624a through 624c. The course of the upper sides 623 is difficult to describe. However, they are essentially configured in such a manner that they first extend in counter-clockwise manner along almost one third of the periphery of the outside edge of the piezo sensor element 622 and then extend inward in the way of an inside tetrant area in the way of a segment of a circle. Consequently, in some way, the upper sides 623 represent very short helical line segments that have been drawn inward and have an enlarged inner end. With this, the effective diameter and thus also the piezo voltage UH can be increased, i.e., in the directions as indicated in FIG. 14. Inasmuch as the electrode voltage that can be tapped from the sensor element or that prevails between the contact pad 625 and the upper side 623 is proportional to the diameter of the piezo sensor element 622, it is of advantage when the segments of the upper sides 622 have the largest possible effective diameter perpendicular to the bending line. For the same bending deflection along such a bending line, the same voltage UH is generated on two opposing upper sides 623, i.e., for example 623a and 623c. The bending deflection is the same whenever the key is pressed exactly in the middle between the two electrodes. Inasmuch as this can be evaluated for two oppositely arranged upper-side pairs, respectively, an upgrading of three voltages permits a position-accurate centered position location of the key touch or the location of control or placement of a finger. Also, such an embodiment is still possible, either with fewer or more divisions.

FIG. 15 shows another modification of a control mechanism 711. This control mechanism 711 comprises elements 722a and 722b having upper sides 723a and 723b, approximately corresponds to that of FIG. 11, whereby the four superimposed sensor elements 725a, 725a' and the superimposed 725b, 725b' are used to form a more planar type of control panel. FIG. 16 shows how, in the case of the depicted pressure point close to the piezo sensor element 725a, the signal deviation S of said element is greater than in the case of the others. Here, it is possible to use the ratio of the four individual signal levels or signal deviations S of the individual piezo sensor elements to accomplish a two-dimensional localization. This means that an evaluation may take place not only in addition to a control or actuation in one direction or along a line but also across an area. Considering the first option, reduced effort and cost are possible, for example compared with the control mechanism 411 in accordance with FIG. 11, in that piezo sensor elements are omitted. Furthermore, it is possible to add another direction for control to provide more control options.

FIG. 17 shows another control mechanism 811 in accordance with the invention, said mechanism comprising a faceplate 813 and a front side 814 that has essentially a design similar to that of FIG. 1. A printed circuit board 819 is fastened to a rear side 815 of the faceplate 813 by means of an adhesive layer 817, said circuit board 819 being configured as the carrier for piezo sensor elements 822a, 822b and 822c on its rear side 820. When the control mechanism 811 is viewed in plan view in accordance with FIG. 18, it can be seen that the strip conductors 826 or corresponding copper pads or contact pads are provided, on the one hand, and that 826a' and 826b' are provided, on the other hand, for the individual piezo sensor elements 822. The greatly enlarged sectional view of FIG. 19 shows the exact setup. The piezo sensor elements 822 are fastened to the rear side 820 of the printed circuit board 819 on strip conductors 826 and 826' by means of soldering tin, this alternatively also potentially being a conductive adhesive, i.e., an electrically conductive adhesive. This is done in that soldering tin 827 is used to mechanically fasten and electrically connect a piezo ceramic disk 837 to the strip conductors 826'. For better soldering, the piezo ceramic disks 837 are advantageously provided with a thin metal layer, for example a silver layer.

In its outside region, one underside of the metal membrane 838 of the piezo sensor element 822 that is undetachably bonded to the piezo ceramic disk 837 by cementing or the like is electrically connected to the strip conductors 826 and mechanically fastened by means of soldering tin 827. Alternatively, it is also possible in this case to use a conductive adhesive. The strip conductor 826 may be configured, for example, like a partial circle, and essentially enclose the strip conductors 826' or contact pads with one interruption so that they may be led out in accordance with FIG. 18.

With the assemblies and, first and foremost, the electrical contact shown in FIGS. 17 through 19 where the piezo sensor elements are fastened with the ceramic side facing the printed circuit board, the contact brackets 31a, 31b and 31c in accordance with FIGS. 1 and 3 may be omitted. As a result of this, each and every electrical contact on the piezo sensor element is provided on one side, i.e., advantageously, on the side facing the printed circuit board. Consequently, the entire assembly and electrical contacting of the printed circuit board, including the piezo sensor elements, can be performed in a single step.

The invention claimed is:

1. A control mechanism for an electrical appliance comprising:
    a control panel that is deformable or elastic, whereby at least one piezo sensor element is arranged under said control panel, wherein the at least one piezo sensor element is arranged on the rear side of a printed circuit board with the opposing front side of said printed circuit board attached or fastened in a planar manner to the underside of the control panel,
    wherein said at least one piezo sensor element comprises a piezo ceramic disk that is bonded to a metal membrane, said piezo sensor element having a planar electrical connection on its upper side, as well as on its underside,
    wherein contact pads with contact leads connected thereto are provided on the printed circuit board, and said at least one piezo sensor element is fastened in a planar manner for electrical contact on the connecting field to the printed circuit board in an electrically conductive manner, and
    wherein the piezo ceramic disk faces the printed circuit board and is in direct contact therewith as a one-sided contact instead of as a two-sided contact.

2. The control mechanism as in claim 1, wherein several piezo sensor elements are arranged on the printed circuit board.

3. The control mechanism as in claim 1, wherein said at least one piezo sensor element is disk-like in shape or is configured as a thin flat disk, and a flat side of said piezo sensor element is fastened to the printed circuit board.

4. The control mechanism as in claim 1, wherein said at least one piezo sensor element comprises of only one piezo ceramic disk comprising one electrical connection on the upper side and one on the underside, respectively, the upperside and the underside electrical connections, respectively, being led via a metal coating of the piezo ceramic disk to the other side so that both electrical contacts are provided on only one side.

5. The control mechanism as in claim 1, wherein an additional electrical contact comprising a contact bracket is provided on the side of the piezo sensor element facing away from the printed circuit board, said contact bracket extending from an additional electrical contact field including the connecting lead on the printed circuit board next to the piezo sensor element to the exposed side of said piezo sensor element, whereby the contact bracket is fastened to the connecting field of the printed circuit board and is pushed against the piezo sensor element.

6. The control mechanism as in claim 5, wherein the contact bracket is a surface mount device component.

7. The control mechanism as in claim 5, wherein the contact bracket is a bonding wire.

8. The control mechanism as in claim 1, wherein an electrical contact with the upper side of the piezo sensor elements occurs via a second printed circuit board applied thereto, said second printed circuit board is fastened, to a first circuit, whereby an electrical contact of the second printed circuit board with the piezo sensor elements or with the electrical connecting fields of the first printed circuit board occurs via flexible contact connectors of electrically conductive plastic.

9. The control mechanism as in claim 1, wherein, on the side of the piezo sensor element facing away from the printed circuit board, there is a division into several electrically conductive surfaces for electrical contact, each of said surfaces being individually connected.

10. The control mechanism as in claim 9, wherein several electrically conductive surfaces have a shape that deviates from a circular or rectangular form that is divided by straight lines, thereby forming a shape having intertwined portions.

11. The control mechanism as in claim 1, wherein an additional electrical contact accomplishes the contact through a printed conductive layer, said layer printed on the likewise printed insulating layer on the support.

12. The control mechanism as in claim 1, wherein several piezo sensor elements are arranged in a row.

13. The control mechanism as in claim 12, wherein several piezo sensor elements are arranged in several parallel rows, said piezo sensor elements being arranged opposite each other in rows.

14. The control mechanism as in claim 1, wherein several piezo sensor elements are provided wherein each peizo sensor element is configured identically having an elongated rectangular shape with one long side and one short side, whereby the long sides of the piezo sensor elements are arranged so as to be parallel to each other.

15. The control mechanism as in claim 14, wherein the long sides of the piezo sensor elements are arranged so as to be parallel to each other along a line, wherein said piezo sensor element are positioned with said long sides having an angle between 45° and 80° relative to said line.

16. The control mechanism as in claim 1, wherein the front side of the printed circuit board with the piezo sensor elements is fastened by adhesion using a double-sticky adhering adhesive tape to the rear side of the control panel.

17. The control mechanism as in claim 1, wherein said mechanism is configured free of a counter surface for the piezo sensor elements, and its side facing away from the control panel is exposed.

18. The control mechanism as in claim 1, wherein the control panel comprises metal having a thickness of approximately 1 mm, said control panel having a constant thickness in the region of the piezo sensor elements.

19. The control mechanism as in claim 1, wherein the control mechanism comprises a signal analyzer that comprises an impedance conversion circuit configured to convert the signal generated by a piezo sensor element, said impedance conversion circuit comprising a transistor circuit and a connection to a microcontroller.

20. The control mechanism as in claim 19, wherein the signal analyzer includes a differentiator circuit to determine a signal difference between two adjacent piezo sensor elements, said differentiator circuit connected to said piezo sensor elements, and the output of the differentiator circuit is sent to further processing or evaluation, wherein if there are at least three piezo sensor elements, then two adjacent piezo sensor elements, respectively, are connected to said differentiator circuit, and the output of an adjacent differentiator circuit is sent to said microcontroller.

21. The control mechanism as in claim 20, wherein the differentiator circuit comprise operational amplifiers with downstream signal amplification.

22. The control mechanism as in claim 20, wherein the differentiator circuit is implemented in said microcontroller.

23. Procedure for evaluating a control mechanism as in claim 1 wherein an output signal of a piezo senso element passes through an impedance conversion for evaluation, the result of said impedance conversion being directly output to an A/D conversion input of a microcontroller.

24. Procedure as in claim 23, wherein, between one piezo sensor element and the respectively closest directly adjacent piezo sensor element, a signal difference is determined between their output signals, in which case, between each piezo sensor element and its two adjacent piezo sensor elements, respectively, the signal difference is determined, whereby the resultant signal differences are analyzed in a microcontroller to determine the piezo sensor element at which a maximum exists following the difference determination, and this piezo sensor element is evaluated as verified for triggering a function assigned to it via the control mechanism.

25. A control mechanism for an electrical appliance comprising:
a control panel that is deformable or elastic, whereby at least one piezo sensor element is arranged under said control panel, wherein the at least one piezo sensor element is arranged on the rear side of a printed circuit board with the opposing front side of said printed circuit board attached or fastened in a planar manner to the underside of the control panel,
wherein said at least one piezo sensor element comprises a piezo ceramic disk that is bonded to a metal membrane, said piezo sensor element having a planar electrical connection on its upper side, as well as on its underside,
wherein an additional electrical contact comprising a contact bracket is provided on the side of the piezo sensor element facing away from the printed circuit board, said contact bracket extending from an additional electrical contact field including the connecting lead on the printed circuit board next to the piezo sensor element to the exposed side of said piezo sensor element, whereby the contact bracket is fastened to the connecting field of the printed circuit board and is pushed against the piezo sensor element, and
wherein the piezo ceramic disk faces the printed circuit board and is in direct contact therewith as a one-sided contact instead of as a two-sided contact.

* * * * *